United States Patent
Li et al.

(10) Patent No.: US 12,341,279 B2
(45) Date of Patent: Jun. 24, 2025

(54) BALL GRID ARRAY CARD EDGE CONNECTOR

(71) Applicant: Intel Corporation, Santa Clara, CA (US)

(72) Inventors: Xiang Li, Portland, OR (US); Mo Liu, Santa Clara, CA (US); Shaohua Li, Pleasanton, CA (US); Jingbo Li, Portland, OR (US); Kai Xiao, Portland, OR (US)

(*) Notice: Subject to any disclaimer, the term of this patent is extended or adjusted under 35 U.S.C. 154(b) by 761 days.

(21) Appl. No.: 17/202,961

(22) Filed: Mar. 16, 2021

(65) Prior Publication Data

US 2021/0203094 A1    Jul. 1, 2021

(51) Int. Cl.
*H01R 12/73*    (2011.01)
*H01R 12/57*    (2011.01)
(Continued)

(52) U.S. Cl.
CPC ........... *H01R 12/737* (2013.01); *H01R 12/57* (2013.01); *H01R 12/721* (2013.01); *H01R 13/26* (2013.01);
(Continued)

(58) Field of Classification Search
CPC .... H01R 12/737; H01R 12/57; H01R 12/721; H01R 13/26; H01R 12/50; H01R 12/716;
(Continued)

(56) References Cited

U.S. PATENT DOCUMENTS

| 5,872,051 A * | 2/1999 | Fallon ............... H01L 23/49811 |
| | | 257/E21.511 |
| 6,431,889 B1 * | 8/2002 | Olson .................... H01R 13/40 |
| | | 439/157 |

(Continued)

FOREIGN PATENT DOCUMENTS

| EP | 0926779 A1 | 3/2004 |
| EP | 1306928 A1 | 1/2006 |

(Continued)

OTHER PUBLICATIONS

European Patent Office, Communication Pursuant to Article 94(3) EPC dated Apr. 25, 2024 in European Patent Application No. 22156716.7 (5 pages).

(Continued)

*Primary Examiner* — Alexander Gilman
(74) *Attorney, Agent, or Firm* — Haley Guiliano LLP (57) ABSTRACT

In one embodiment, a card edge connector includes: a housing having an opening into which a first circuit board is to be inserted; a plurality of pins each having a first end and a second end, the plurality of pins extending from within the opening through a bottom surface of the housing, the first end of the first plurality of pins to mate with a corresponding contact of the first circuit board; and a plurality of ball grid array (BGA) solder balls each adapted at the second end of a corresponding one of the plurality of pins, the plurality of pins to mate with a corresponding conductive area of a second circuit board to which the card edge connector mates (Continued)

via the plurality of BGA solder balls. Other embodiments are described and claimed.

20 Claims, 5 Drawing Sheets

(51) Int. Cl.
*H01R 12/72* (2011.01)
*H01R 13/26* (2006.01)
*H05K 1/18* (2006.01)

(52) U.S. Cl.
CPC ... *H05K 1/181* (2013.01); *H05K 2201/10189* (2013.01); *H05K 2201/10734* (2013.01)

(58) Field of Classification Search
CPC ........ H01R 13/40; H01R 12/51; H01R 13/02; H05K 1/181; H05K 2201/10189; H05K 2201/10734; H05K 1/141; H05K 3/3436; H05K 1/111; Y02P 70/50
USPC .......................................................... 439/62
See application file for complete search history.

(56) References Cited

U.S. PATENT DOCUMENTS

| | | | | |
|---|---|---|---|---|
| 7,075,795 | B2 * | 7/2006 | Wu | H01R 12/00 |
| | | | | 439/950 |
| 7,476,110 | B2 * | 1/2009 | Lemke | H01R 43/20 |
| | | | | 439/876 |
| 7,488,192 | B1 * | 2/2009 | Eagle | H01R 12/714 |
| | | | | 439/159 |
| 7,815,451 | B2 * | 10/2010 | Simon | H01R 12/7011 |
| | | | | 439/910 |
| 8,382,487 | B2 * | 2/2013 | Jeon | H01R 12/57 |
| | | | | 439/83 |
| 10,729,030 | B1 * | 7/2020 | Cousineau | G06F 13/409 |
| 2002/0048986 | A1 * | 4/2002 | Lewis | H01R 12/721 |
| | | | | 439/345 |
| 2003/0236005 | A1 * | 12/2003 | Wu | H01R 12/526 |
| | | | | 439/61 |
| 2005/0170697 | A1 * | 8/2005 | Takada | H01R 12/57 |
| | | | | 439/628 |
| 2005/0207131 | A1 * | 9/2005 | Prokofiev | H05K 7/1092 |
| | | | | 257/E23.079 |
| 2005/0239301 | A1 * | 10/2005 | Morana | H01R 43/0256 |
| | | | | 439/70 |
| 2009/0200362 | A1 * | 8/2009 | Jung | B23K 1/0016 |
| | | | | 228/256 |
| 2011/0104913 | A1 * | 5/2011 | Hinkle | H01R 43/205 |
| | | | | 439/68 |
| 2014/0291868 | A1 * | 10/2014 | Lee | H01L 25/50 |
| | | | | 257/777 |
| 2016/0087361 | A1 * | 3/2016 | Summers | H01L 23/147 |
| | | | | 228/256 |
| 2018/0351277 | A1 * | 12/2018 | Beaman | H01R 13/2492 |
| 2019/0037689 | A1 * | 1/2019 | Du | H05K 1/115 |
| 2019/0131730 | A1 * | 5/2019 | Teng | H01R 12/7052 |
| 2020/0014136 | A1 * | 1/2020 | Jiang | H01R 12/721 |
| 2021/0153351 | A1 * | 5/2021 | Li | H01R 12/58 |
| 2021/0159625 | A1 * | 5/2021 | Moon | H01R 12/737 |
| 2021/0384659 | A1 * | 12/2021 | Tower | H01R 12/737 |
| 2022/0021139 | A1 * | 1/2022 | Li | H01R 12/737 |
| 2024/0072494 | A1 * | 2/2024 | He | H01R 13/6588 |

FOREIGN PATENT DOCUMENTS

| | | |
|---|---|---|
| JP | 2002056928 A | 2/2002 |
| JP | 2002203624 A | 7/2002 |
| WO | 2012138519 A2 | 10/2012 |

OTHER PUBLICATIONS

Zhineng Fan, "The Evolution of CEM Connectors: Almost 20 Years in the Making," PCI-SIG, 2021, 2 pages total.
European Patent Office, Search Report mailed Jul. 15, 2022 in European Patent Application No. 22156716.7 (13 pages).

* cited by examiner

BALL GRID ARRAY CARD EDGE CONNECTOR

BACKGROUND

Data rates of electrical signals sent via Peripheral Component Interconnect Express (PCIe)-based communications in accordance with PCIe specifications have increased dramatically over time. For example, PCIe data rates have octupled from Gen3 (8 gigabits per second (Gbps)) to Gen6 (64 Gbps pulse amplitude modulation 4-level (PAM4)) in less than a decade. At the same time, electrical signal integrity requirements in platform interconnects have become increasingly stringent.

Many PCIe-based communications occur between devices that connect together using a card edge connector such as a card electromechanical (CEM) connector. Historically for PCIe implementations, through hole mount (THM) CEM connectors were used, and now with PCIe 5.0 in accordance with the PCIe Card Electromechanical Specification Rev. 4.0 (September 2019), surface mount technology (SMT) CEM connectors are used due to electrical performance requirements. However, current SMT connectors still have relatively large footprints, which have direct impact in performance. In addition, the size of solder pads requires the entry of a trace to come into the connector only in one direction, which limits routing flexibility and potentially drives longer PCIe routes and board size.

DETAILED DESCRIPTION

In various embodiments, a card edge connector may be configured with ball grid array (BGA) solder balls to provide interconnection between the card edge connector and a printed circuit board, such as a motherboard of a given system. With this arrangement, another circuit board such as an add-in card can be adapted within the card edge connector to provide high speed communications while maintaining acceptable signal integrity. In addition, easier routing through the motherboard may be realized, as both signal routing from outside the connector footprint (toe-based) and signal routing from inside the connector footprint (heel-based) routing may be used to communicate signals to/from components on the add-in card to components on the motherboard.

Figure 1:
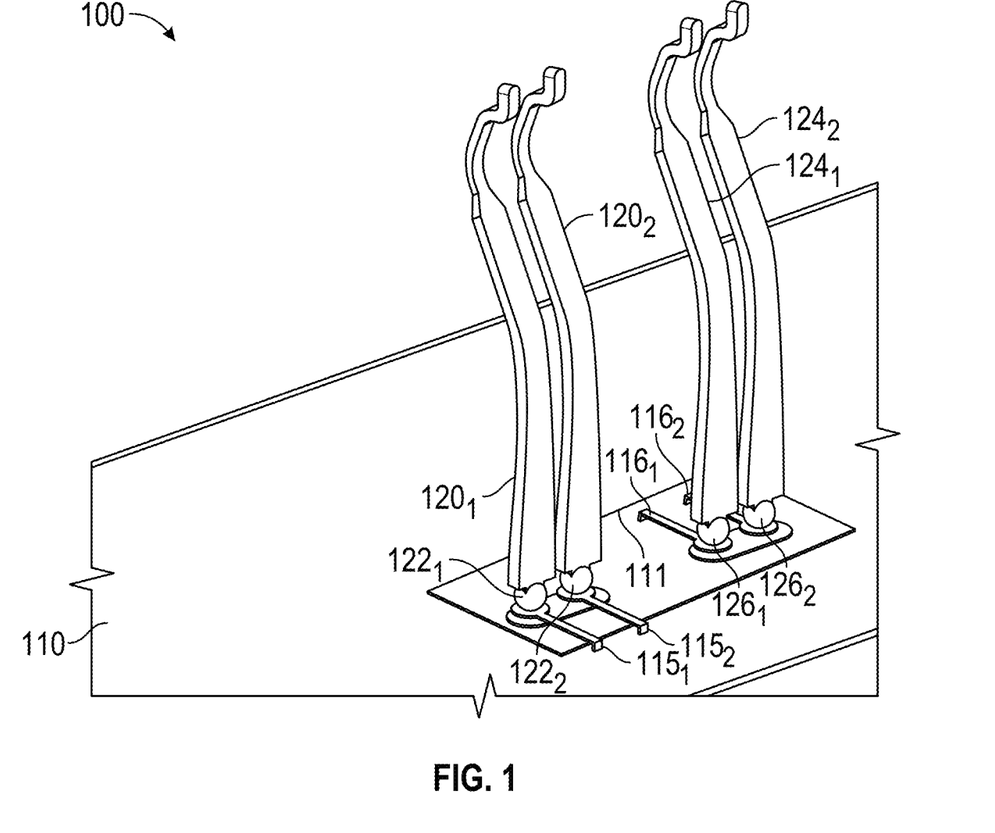
FIG. 1 is an illustration of a system arrangement in accordance with an embodiment.

Referring now to FIG. 1, shown is an illustration of a system arrangement in accordance with an embodiment. As shown in FIG. 1, a system 100 includes a printed circuit board 110. In various implementations, circuit board 110 may be a main motherboard of a system. Circuit board 110 may be a multi-layer circuit board that includes internal routing interconnections, as well as provides connection for various system components, including integrated circuit packages, electrical components, power supply components, connectors and so forth. In addition, circuit board 110 provides a connection area (generally 111) to which a card edge connector may be adapted. While this embodiment is for an implementation of a card electromechanical (CEM) connector, understand embodiments are not so limited. In other implementations the card edge connector having BGA solder balls may be a U.2 connector in accordance with the Solid State Form Factor Working Group (SSFFWG), a M.2 connector in accordance with the PCIe M.2 Specification Rev. 4.0 (November 2020), a TA-1002 connector in accordance with the Storage Networking Industry Association (SNIA) Small Form Factor (SFF) Technology Work Group's SFF-TA-1002 specification or memory connectors such as a dual inline memory module (DIMM) connector. Such connectors can be used in connection with solid state drives, non-volatile and volatile memories among other applications. These connectors may be distinguished from conventional card edge connectors having SMT or THM arrangements.

In the high level shown in FIG. 1, rather than a complete CEM connector, only several differential pairs of pins of the CEM connector, namely differential pins $120_{1,2}$ and $124_{1,2}$ (generally pins 120, 124), are shown. As illustrated, pins 120, 124 are affixed to circuit board 110 via BGA solder balls $122_{1,2}$ and $126_{1,2}$. Solder balls 122, 126 may be formed of lead-free tin/silver/copper alloys, and may be adapted to pins 120, 124 via a flux, pin transfer and reflow process. In this way, interconnection is provided between circuitry on a device interconnected to the CEM connector and other components of a system, by way of signal or routing lines $115_{1,2}$ and routing lines $116_{1,2}$.

In the example shown, routing lines 115 may have toe-based routing and routing lines 116 may have heel-based routing. In this way greater flexibility is realized. When the signal trace or pad is not in the signal path (only one end is connected and the other end left floating), this is called a stub. The stub causes resonance and therefore degrades the signal performance. In general, toe-based routing lines leave minimal stub while heel-based routing leave a larger stub. With an embodiment, signal integrity of communications via these different kinds of signal lines may be the same or at least substantially the same.

In various configurations, these routing lines lead from exposed conductive material within a connection area 111 on a surface of the circuit board 110 (such as exposed copper pads to which BGA solder balls 122, 126 are adapted) to other circuitry, such as one or more processor packages or other integrated circuits (ICs) adapted to circuit board 110. Note that these ICs may be adapted to circuit board 110, e.g., by way of through hole mounting (THM), surface mount technology (SMT) or BGA connections, as examples.

By way of BGA solder balls 122, 126 adapted at a bottom portion of corresponding pins 120, 124, greater electrical performance may be realized. In addition a BGA CEM connector in accordance with an embodiment provides routing flexibility and higher mechanical performance as compared to SMT connectors. In an embodiment, a BGA CEM connector may be adapted to a circuit board using a solder reflow process in which the connector is aligned above corresponding conductive pads (within a connection area). The connector is then mated to these pads, e.g., using a flux material. Then the connector is joined to the circuit board by a given assembly process. Understand while shown with only two sets of pins for differential signal pairs for ease of illustration in FIG. 1, a given BGA CEM connector in accordance with an embodiment may include many more pins for additional signal pairs. Furthermore, while a differential implementation such as may be used for providing for communicating PCIe communications is shown, single-ended signals may be communicated using BGA card edge connectors in other implementations.

BGA connectors in accordance with an embodiment may provide, as compared to SMT connectors, better insertion loss and return loss across an interested frequency range due to smaller printed circuit board footprint size. Because of the reduced footprint size, a BGA connector offers much more routing flexibility, and there is no limitation on toe entry or heel entry as otherwise present in a SMT connector. In contrast, a SMT connector with heel entry suffers a severe performance degradation due to the large stub caused by heel routing, which is unavoidable in some board designs because of area constraints. Smaller footprint size enabled with embodiments also fits better in smaller form factor or half width boards. In addition, BGA reflow is easy and offers fewer warpage issues.

Embodiments reduce routing congestion and improve overall connector performance. Using BGA solder balls, a much smaller pad size on a circuit board can be realized. With embodiments, there may be lower capacitive dip for heel-based routing, and lower differential insertion loss and return loss. With a SMT connector, a loss difference for heel-based routing is almost 1.5 dB at a Nyquist frequency of 16 gigahertz (GHz) for PCIe 5.0/6.0. In contrast, with an embodiment there is almost no performance difference with toe routing and heel routing. In addition, a BGA connector has better insertion loss and return loss compared to a SMT connector with toe routing.

Figure 2:
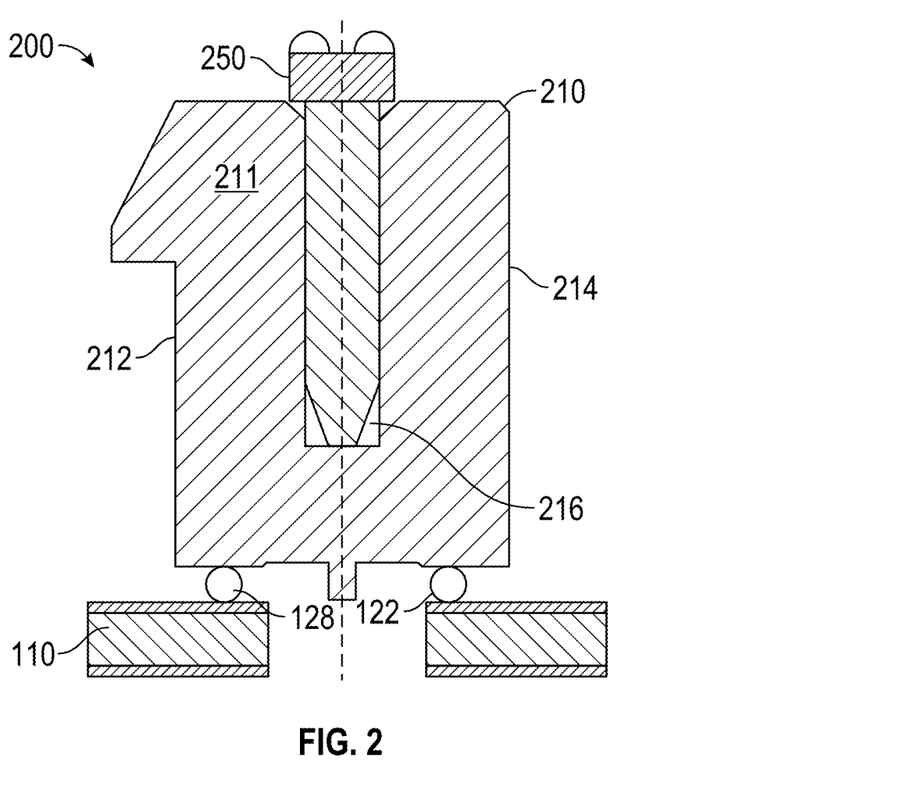
FIG. 2 is a cross-sectional view of a system environment in accordance with an embodiment.

Referring now to FIG. 2, shown is a cross-sectional view of a system environment in accordance with an embodiment. As shown in the cross-section view of FIG. 2, system 200 includes a CEM connector 210 adapted to circuit board 110 by way of BGA solder balls 122, 128. Of course while only two BGA solder balls are shown in this cross-sectional view, many more BGA solder balls may be present in embodiments.

As illustrated, CEM connector 210 includes a housing 211 having a first side 212 and a second side 214. In addition, housing 211 includes a cavity 216 into which a circuit board 250 can be adapted. In various embodiments, circuit board 250 may be any type of suitable add-in card, such as a networking card of a network interface circuit (NIC) or graphics card that provides video/graphics functionality by way of one or more graphics processing units (GPUs). In other cases, circuit board 250 may provide any other type of accelerator or other functional circuitry.

In any event, understand that circuit board 250 may include so-called finger contacts (e.g., gold-plated finger contacts) to which pins of CEM connector 210 mate. While not shown for ease of illustration in FIG. 2, understand that these pins may take the form shown in FIG. 1 and may have first ends that contacts the finger contacts of circuit board 110 and second ends that terminate at corresponding BGA solder balls, e.g., BGA solder balls 122, 128. With this arrangement, routing of signals between components of circuit board 250 and components adapted to circuit board 110 may occur. To this end, signal lines on or within circuit board 110 may terminate at exposed conductive surfaces on circuit board 110 to which BGA solder balls 122, 128 couple. With improved electrical signal integrity using a BGA connector, routing of signals through circuit board 110 may use heel routing or toe routing. In either case, signal integrity may be substantially identical, in contrast to other CEM connector technologies such as through hole mounting or surface mount technologies, in which heel routing may have substantially impaired signal integrity as compared to toe routing. Although shown at this high level in the embodiment of FIG. 2, many variations and alternatives are possible.

To understand the impact of a BGA connector in overall platform performance, a full link level analysis was performed in PCIe 6.0 for a 13 inch mother board routing with base specification assumptions for equalizations. Table 1 below lists an eye opening comparison between a BGA connector in accordance with an embodiment and a SMT connector. While this is an example comparison to illustrate improvements available using one example implementation, understand that embodiments are not limited in this regard. Also keep in mind that the eye opening requirement in PCIe 6.0 is only 6 millivolts (mV)/3.125 picoseconds (ps). There is no link margin difference in a BGA connector with heel routing and toe routing. On the other hand, severe margin degradation is observed in a SMT connector with heel routing compared to toe routing. The eye opening in BGA connector is 4.9 mV/1.6 ps better than SMT connector heel routing in this example. Especially eye height improvement is more than doubled in BGA connector compared to SMT connector with heel routing. What's more, a SMT connector with heel routing fails eye margin requirement and simply would not work at PCIe 6.0 speed. This is so as PAM4 signaling is more sensitive to noise level compared to NRZ signaling. In addition, BGA connector is about 0.5 mv/0.5 ps better than SMT connector with toe routing which is about 8%/16% in eye mask budget. Overall, a BGA connector in accordance with an embodiment shows much better electrical performance as well as routing flexibility compared to SMT connector. Routing flexibility in board architecture planning as well as mechanical performance compared to SMT connector. Furthermore, BGA connector technology can be applied to other card edge connectors such as high speed input/output (IO) (HSIO) connectors as well such as Ethernet, Intel® Ultra Path Interconnect (UPI), universal serial bus (USB) and serial attachment technology (SATA), etc.

TABLE 1

PCIe 6.0 eye opening example connector topology with 13 inch board routing length

|  | Eye Height (mv) | Eye Width (ps) |
| --- | --- | --- |
| BGA connector heel routing | 8.0 (pass) | 5.5 (pass) |
| BGA connector toe routing | 8.0 (pass) | 5.5 (pass) |
| SMT connector heel routing | 3.1 (fail) | 3.9 (pass) |
| SMT connector toe routing | 7.5 (pass) | 5 (pass) |

Figure 3:
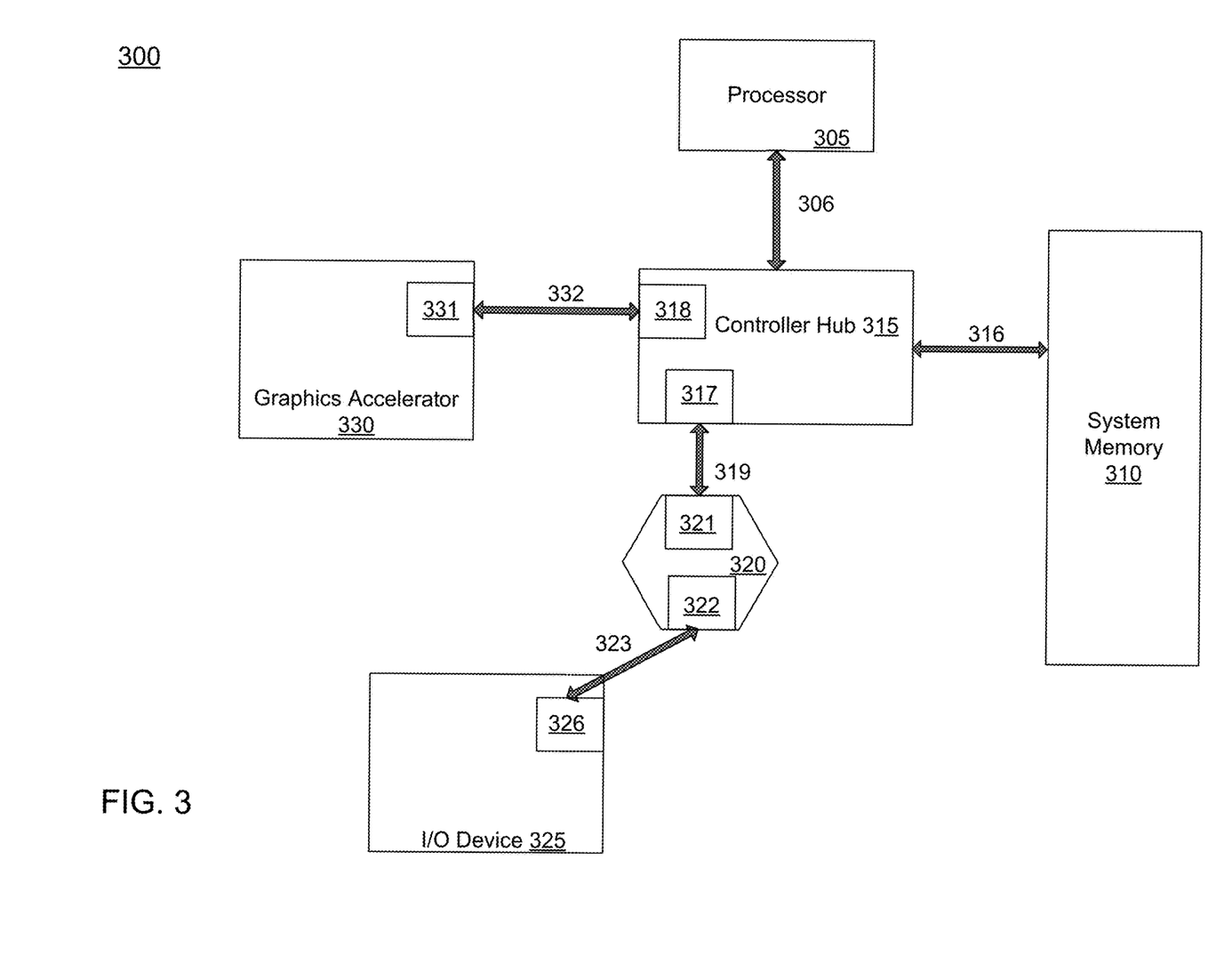
FIG. 3 is an embodiment of a fabric composed of point-to-point links that interconnect a set of components.

Embodiments may be implemented in a wide variety of interconnect structures. Referring to FIG. 3, an embodiment of a fabric composed of point-to-point links that interconnect a set of components is illustrated. System 300 includes processor 305 and system memory 310 coupled to controller hub 315. Processor 305 includes any processing element, such as a microprocessor, a host processor, an embedded processor, a co-processor, or other processor. Processor 305 is coupled to controller hub 315 through a link 306, such as an Intel® UPI serial point-to-point interconnect.

System memory 310 includes any memory device, such as random access memory (RAM), non-volatile (NV) memory, or other memory accessible by devices in system 300. System memory 310 is coupled to controller hub 315 through memory interface 316. Examples of a memory interface include a double-data rate (DDR) memory interface, a dual-channel DDR memory interface, and a dynamic RAM (DRAM) memory interface.

In one embodiment, controller hub 315 is a root hub, root complex, or root controller in a PCIe interconnection hierarchy. Examples of controller hub 315 include a chipset, a memory controller hub (MCH), a northbridge, an interconnect controller hub (ICH), a southbridge, and a root controller/hub. Often the term chipset refers to two physically separate controller hubs, i.e. a memory controller hub (MCH) coupled to an interconnect controller hub (ICH). Note that current systems often include the MCH integrated with processor 305, while controller 315 is to communicate with I/O devices, in a similar manner as described below. In some embodiments, peer-to-peer routing is optionally supported through root complex 315.

Here, controller hub 315 is coupled to switch/bridge 320 through serial link 319. Input/output modules 317 and 321, which may also be referred to as interfaces/ports 317 and 321, include/implement a layered protocol stack to provide communication between controller hub 315 and switch 320. In one embodiment, multiple devices are capable of being coupled to switch 320.

Switch/bridge 320 routes packets/messages from device 325 upstream, i.e., up a hierarchy towards a root complex, to controller hub 315 and downstream, i.e., down a hierarchy away from a root controller, from processor 305 or system memory 310 to device 325. Device 325 includes any internal or external device or component to be coupled to an electronic system via a BGA card edge connector in accordance with an embodiment, such as an I/O device, a NIC, an add-in card, an audio processor, a network processor, a memory expander, a hard-drive, a storage device such as a solid state drive, a CD/DVD ROM, a monitor, a printer, a mouse, a keyboard, a router, a portable storage device, a Firewire device, a Universal Serial Bus (USB) device, a scanner, and other input/output devices. To this end, device 325 may be implemented on a circuit board to be adapted within a BGA card edge connector as described herein.

Graphics accelerator 330 is also coupled to controller hub 315 through serial link 332. In one embodiment, graphics accelerator 330 is coupled to an MCH, which is coupled to an ICH. Switch 320, and accordingly I/O device 325, is then coupled to the ICH. I/O modules 331 and 318 are also to implement a layered protocol stack to communicate between graphics accelerator 330 and controller hub 315. A graphics controller or the graphics accelerator 330 itself may be integrated in processor 305.

Figure 4:
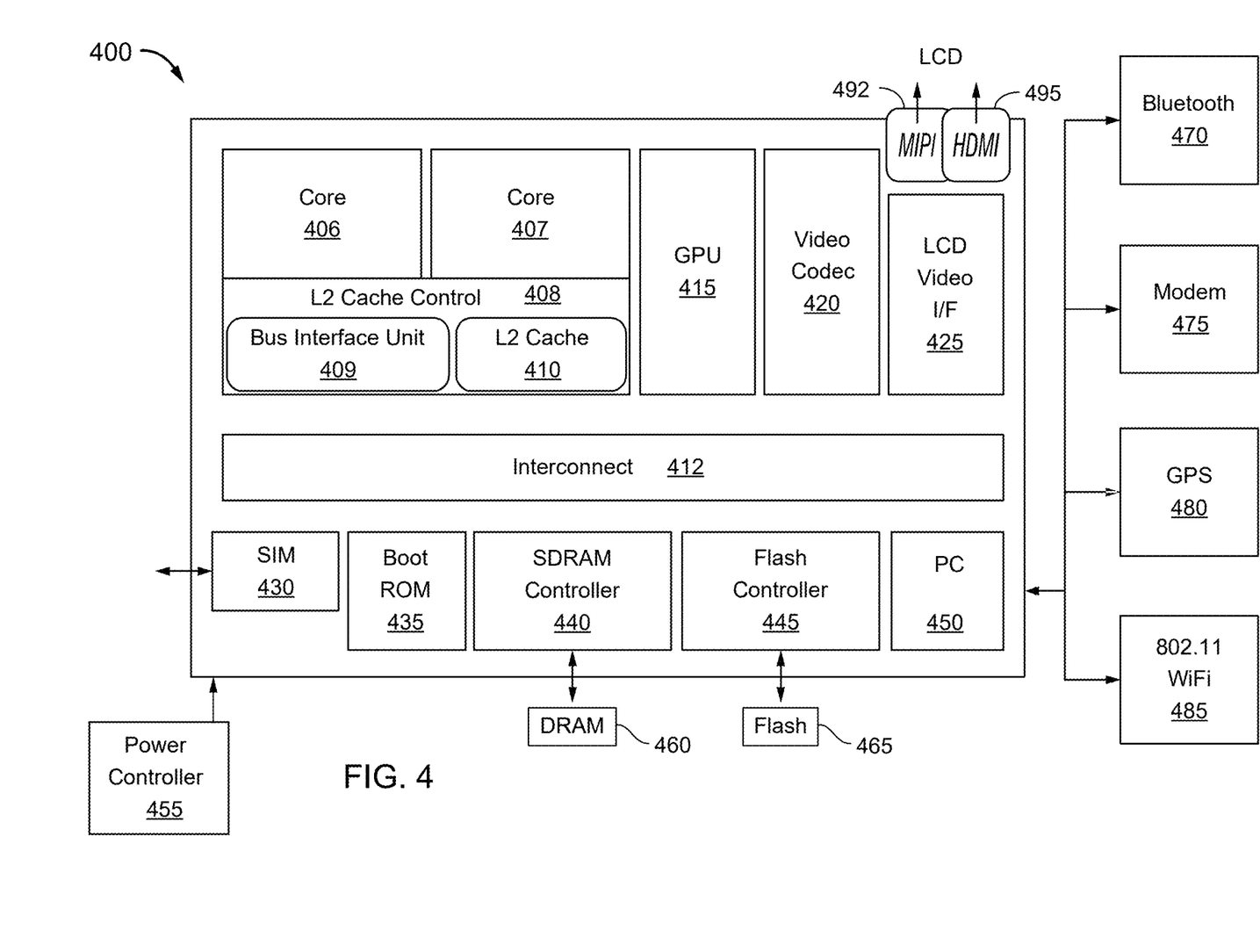
FIG. 4 is an embodiment of a system-on-chip design in accordance with an embodiment.

Turning next to FIG. 4, an embodiment of a SoC design in accordance with an embodiment is depicted. As a specific illustrative example, SoC 400 may be configured for insertion in any type of computing device, ranging from portable device to server system. Here, SoC 400 includes 2 cores 406 and 407. Cores 406 and 407 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 406 and 407 are coupled to cache controller 408 that is associated with bus interface unit 409 and L2 cache 410 to communicate with other parts of system 400 via an interconnect 412.

Interconnect 412 provides communication channels to the other components, such as a Subscriber Identity Module (SIM) 430 to interface with a SIM card, a boot ROM 435 to hold boot code for execution by cores 406 and 407 to initialize and boot SoC 400, a SDRAM controller 440 to interface with external memory (e.g., DRAM 460), a flash controller 445 to interface with non-volatile memory (e.g., flash 465), a peripheral controller 450 to interface with peripherals, video codec 420 and video interface 425 to display and receive input (e.g., touch enabled input), GPU 415 to perform graphics related computations, etc. In addition, the system illustrates peripherals for communication, such as a Bluetooth module 470, 3G modem 475, GPS 480, and WiFi 485, one or more of which may be may be implemented on a circuit board to be adapted within a BGA card edge connector as described herein.

Also included in the system is a power controller 455. Further illustrated in FIG. 4, system 400 may additionally include interfaces including a MIPI interface 492, e.g., to a display and/or an HDMI interface 495 also which may couple to the same or a different display.

Figure 5:
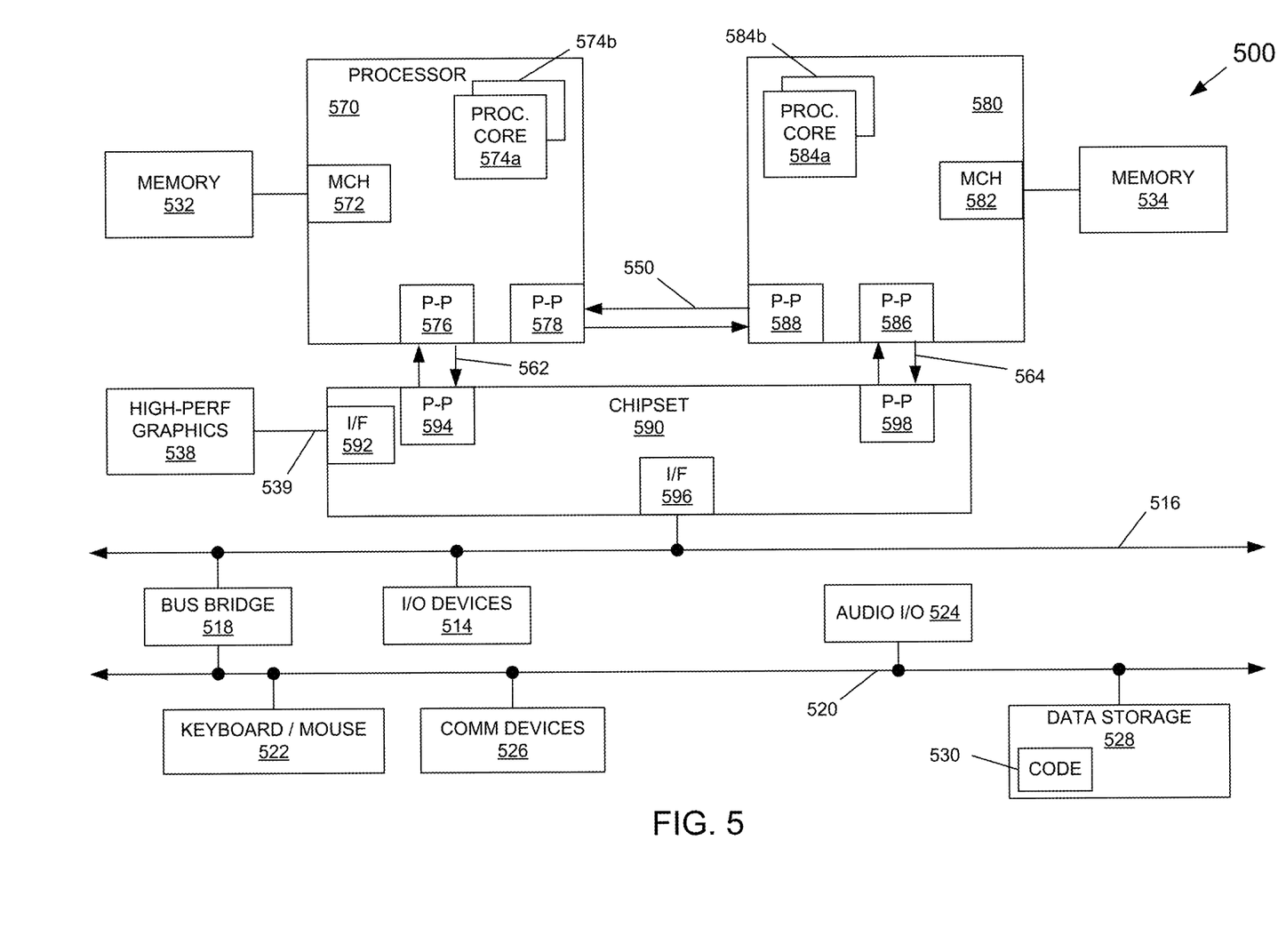
FIG. 5 is a block diagram of a system in accordance with an embodiment of the present invention

Referring now to FIG. 5, shown is a block diagram of a system in accordance with an embodiment of the present invention. As shown in FIG. 5, multiprocessor system 500 includes a first processor 570 and a second processor 580 coupled via a point-to-point interconnect 550. As shown in FIG. 5, each of processors 570 and 580 may be many core processors including representative first and second processor cores (i.e., processor cores 574a and 574b and processor cores 584a and 584b).

Still referring to FIG. 5, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 5, MCH's 572 and 582 couple the processors to respective memories, namely a memory 532 and a memory 534, which may be portions of system memory (e.g., DRAM) locally attached to the respective processors. First processor 570 and second processor 580 may be coupled to a chipset 590 via P-P interconnects 562 and 564, respectively. As shown in FIG. 5, chipset 590 includes P-P interfaces 594 and 598.

Furthermore, chipset 590 includes an interface 592 to couple chipset 590 with a high performance graphics engine 538, by a P-P interconnect 539. As shown in FIG. 5, various input/output (I/O) devices 514 may be coupled to a first bus 516, along with a bus bridge 518 which couples first bus 516 to a second bus 520. One or more of I/O devices 514 may be implemented on a circuit board to be adapted within a BGA card edge connector as described herein.

Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520.

The following examples pertain to further embodiments.

In one example, a card edge connector includes: a housing having an opening into which a first circuit board is to be inserted; a plurality of pins each having a first end and a second end, the plurality of pins extending from within the opening through a bottom surface of the housing, the first end of the plurality of pins to mate with a corresponding contact of the first circuit board; and a plurality of BGA solder balls each adapted at the second end of a corresponding one of the plurality of pins, the plurality of pins to mate with a corresponding conductive area of a second circuit board to which the card edge connector mates via the plurality of BGA solder balls.

In an example, the card edge connector comprises a BGA connector.

In an example, the BGA connector comprises a PCIe connector to receive the first circuit board comprising a PCIe circuit board.

In an example, the card edge connector is to be adapted to an edge portion of the second circuit board, the second circuit board comprising a motherboard.

In an example: at least a first portion of the plurality of pins are to couple with first corresponding conductive areas of the second circuit board to which heel-routed signal lines are connected; and at least a second portion of the plurality of pins are to couple with second corresponding conductive areas of the second circuit board to which toe-routed signal lines are connected.

In an example, the card edge connector is to enable communication between at least one memory device adapted to the first circuit board and a processor adapted to the second circuit board.

In another example, a system comprises: a processor adapted on a circuit board; the circuit board including a first connection area on a surface thereof, the circuit board further including a plurality of signal lines to couple the processor to one or more devices on a second circuit board; and a card edge connector adapted to the first connection area of the circuit board via a plurality of solder balls at a bottom surface of the card edge connector, the card edge connector having a housing with an opening into which the second circuit board is inserted.

In an example, the card edge connector further comprises a plurality of pins each having a first end and a second end, the plurality of pins extending from within the opening through the bottom surface, the first end of the plurality of pins to mate with a corresponding contact of the second circuit board.

In an example, the plurality of solder balls comprises a plurality of BGA solder balls each adapted at the second end of a corresponding one of the plurality of pins, each of the plurality of pins coupled to a corresponding conductive pad of the first connection area via one of the plurality of BGA solder balls.

In an example: at least a first portion of the plurality of pins are to couple with first corresponding conductive pads of the first connection area to which first signal lines from within a footprint of the card edge connector are connected; and at least a second portion of the plurality of pins are to couple with second corresponding conductive pads of the first connection area to which second signal lines from outside the footprint of the card edge connector are connected.

In an example, the card edge connector is communicate signals at a data rate of at least 64 gigabits per second.

In an example, the system further comprises one or more memory devices adapted to the second circuit board.

In an example, the card edge connector comprises a BGA PCIe connector and the second circuit board comprises a PCIe circuit board.

In an example, the second circuit board comprises a network interface circuit.

In an example, the card edge connector is to be adapted to an edge portion of the circuit board, the circuit board comprising a motherboard.

In yet another example, a CEM connector comprises: a housing having an opening to receive a first circuit board; a plurality of pins each having a first end and a second end, the plurality of pins extending from within the opening through a bottom surface of the housing, the first end of each of the plurality of pins to mate with a corresponding contact of the first circuit board; and a plurality of solder balls each adapted at the second end of a corresponding one of the plurality of pins, the plurality of pins to mate with a corresponding conductive pad on a motherboard to which the CEM connector mates via the plurality of solder balls.

In an example, the CEM connector comprises a PCIe connector to receive the first circuit board comprising a PCIe circuit board.

In an example, the plurality of solder balls comprises ball grid array solder balls.

In an example: at least a first portion of the plurality of pins are to couple with first corresponding conductive pads on the motherboard to which toe-routed signal lines are connected; and at least a second portion of the plurality of pins are to couple with second corresponding conductive areas of the motherboard to which heel-routed signal lines are connected.

In an example, the CEM connector is to enable signal integrity of first signals communicated via the heel-routed signal lines to be at least substantially equal to signal integrity of second signals communicated via the toe-routed signal lines.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A card edge connector, comprising:
   a housing having an opening into which a first circuit board is to be inserted;
   pins, wherein an individual pin includes a first end and a second end, the pins extending from within the opening through a bottom surface of the housing, the first end of the pins to mate with a corresponding contact of the first circuit board, the pins formed in a row of first aligned pins and a row of second aligned pins opposite the row of first aligned pins, wherein:
      at least a first portion of the pins of the row of first aligned pins and the row of second aligned pins are to couple with first corresponding conductive areas of a second circuit board to which heel-routed signal lines are connected, and
      at least a second portion of the pins of the row of first aligned pins and the row of second aligned pins are to couple with second corresponding conductive areas of the second circuit board to which toe-routed signal lines are connected; and
   ball grid array (BGA) solder balls, wherein an individual BGA solder ball of the BGA solder balls is at the second end of a corresponding one of the pins, the pins to mate with the first and second corresponding conductive area areas of the second circuit board to which the card edge connector mates via the BGA solder balls, wherein:
      the card edge connector is to be adapted to an edge portion of the second circuit board,
      the second circuit board includes a motherboard,
      the pins are connected to the motherboard through pads and routing traces,
      the pads include the first and second corresponding conductive area areas, and
      the routing traces are connected to the pads.

2. The card edge connector of claim 1, wherein the card edge connector is to enable communication between at least one memory device coupled to the first circuit board and a processor coupled to the second circuit board.

3. The card edge connector of claim 1, wherein the card edge connector comprises a BGA connector.

4. The card edge connector of claim 3, wherein the BGA connector comprises a Peripheral Component Interconnect Express (PCIe) connector.

5. The card edge connector of claim 4, wherein the PCIe connector is to receive the first circuit board.

6. The card edge connector of claim 5, wherein the first circuit board includes a PCIe circuit board.

7. A system, comprising:
   a processor;
   a first circuit board, the first circuit board including a first connection area on a surface thereof, the first circuit board further including a plurality of signal lines to couple the processor to one or more devices on a second circuit board; and
   a card edge connector coupled to the first connection area of the first circuit board via a plurality of solder balls at a bottom surface of the card edge connector, the card edge connector having a housing with an opening into which the second circuit board is inserted, the card edge connector comprising
   pins each having a first end and a second end, wherein the pins extend from within the opening through the bottom surface, the first end of the pins is to mate with a corresponding contact of the second circuit board, and the pins are formed in a row of first aligned pins and a row of second aligned pins opposite the row of first aligned pins, and
   wherein:
      at least a first portion of the pins of the row of first aligned pins and the row of second aligned pins are to couple with first corresponding conductive pads of the first connection area to which first signal lines from within a footprint of the card edge connector are connected,
      at least a second portion of the pins of the row of first aligned pins and the row of second aligned pins are to couple with second corresponding conductive pads of the first connection area to which second signal lines from outside the footprint of the card edge connector are connected,
      the card edge connector is to be adapted to an edge portion of the first circuit board,
      the first circuit board includes a motherboard,
      the pins are connected to the motherboard through pads and routing traces,
      the pads include the first corresponding conductive pads of the first connection area and the second corresponding conductive pads of the first connection area, and
      the routing traces include the first signal lines and the second signal lines.

8. The system of claim 7, wherein the plurality of solder balls comprises a plurality of ball grid array (BGA) solder balls each adapted at the second end of a corresponding one of the pins.

9. The system of claim 8, wherein each of the pins is coupled to a corresponding conductive pad of the first connection area via one of the plurality of BGA solder balls.

10. The system of claim 7, wherein the cardedge connector is to communicate signals at a data rate of at least 64 gigabits per second.

11. The system of claim 7, further comprising one or more memory devices coupled to the second circuit board.

12. The system of claim 7, wherein the card edge connector comprises a ball grid array (BGA) Peripheral Component Interconnect Express (PCIe) connector.

13. The system of claim 12, wherein the second circuit board comprises a PCIe circuit board.

14. The system of claim 7, wherein the second circuit board comprises a network interface circuit.

15. A card electromechanical (CEM) connector, comprising:
   a housing having an opening to receive a first circuit board;
   a plurality of pins, wherein each of the pins has a first end and a second end, the pins extend from within the opening through a bottom surface of the housing, and the first end of each of the pins is to mate with a corresponding contact of the first circuit board; and
   a plurality of solder balls, wherein each of the solder balls is adapted at the second end of a corresponding one of the pins, and the pins are to mate with a corresponding conductive pad on a motherboard to which the CEM connector is connected via the solder balls, wherein:
the plurality of pins are formed in a row of first aligned pins and a row of second aligned pins opposite the row of first aligned pins,
at least a first portion of the plurality of pins of the row of first aligned pins and the row of second aligned pins are to couple with first corresponding conductive pads on the motherboard to which heel-routed signal lines are connected,
at least a second portion of the plurality of pins of the row of first aligned pins and the row of second aligned pins are to couple with second corresponding conductive pads of the motherboard to which toe-routed signal lines are connected,
the pins are connected to the motherboard through pads and routing traces,
the pads include the first corresponding conductive pads and the second corresponding conductive pads, and the routing traces include the heel-routed signal lines and the toe-routed signal lines.

16. The CEM connector of claim 15, wherein the CEM connector is to enable signal integrity of first signals communicated via the heel-routed signal lines to be at least substantially equal to signal integrity of second signals communicated via the toe-routed signal lines.

17. The CEM connector of claim 15, wherein the CEM connector comprises a Peripheral Component Interconnect Express (PCIe) connector.

18. The CEM connector of claim 17, wherein the plurality of solder balls comprises ball grid array solder balls.

19. The CEM connector of claim 17, wherein the PCIe connector is to receive the first circuit board.

20. The CEM connector of claim 19, wherein the first circuit board includes a PCIe circuit board.

* * * * *